(12) United States Patent
Sezginer et al.

(10) Patent No.: US 7,170,604 B2
(45) Date of Patent: Jan. 30, 2007

(54) OVERLAY METROLOGY METHOD AND APPARATUS USING MORE THAN ONE GRATING PER MEASUREMENT DIRECTION

(75) Inventors: Abdurrahman Sezginer, Los Gatos, CA (US); Kenneth Johnson, Santa Clara, CA (US)

(73) Assignee: Tokyo Electron Limited, Tokyo (JP)

( * ) Notice: Subject to any disclaimer, the term of this patent is extended or adjusted under 35 U.S.C. 154(b) by 64 days.

(21) Appl. No.: 10/613,378

(22) Filed: Jul. 3, 2003

(65) Prior Publication Data

US 2005/0122516 A1 Jun. 9, 2005

Related U.S. Application Data

(60) Provisional application No. 60/394,802, filed on Jul. 10, 2002, provisional application No. 60/394,191, filed on Jul. 3, 2002.

(51) Int. Cl.
*G01B 11/00* (2006.01)
*G03F 9/00* (2006.01)
*G03C 5/00* (2006.01)
*H01L 23/544* (2006.01)
*H01L 21/76* (2006.01)

(52) U.S. Cl. .................. 356/400; 356/401; 430/22; 430/30; 257/797; 438/401

(58) Field of Classification Search ........ 356/399–401; 430/5, 22, 30; 438/401; 257/797; 250/548; 355/53, 55, 77
See application file for complete search history.

(56) References Cited

U.S. PATENT DOCUMENTS

| 6,532,076 B1 | 3/2003 | Sidorowich | 356/630 |
| 6,855,464 B1 * | 2/2005 | Niu et al. | 430/5 |
| 6,947,141 B1 * | 9/2005 | Bischoff et al. | 356/369 |
| 6,982,793 B1 * | 1/2006 | Yang et al. | 356/401 |
| 2002/0135875 A1 | 9/2002 | Niu et al. | 359/564 |

(Continued)

FOREIGN PATENT DOCUMENTS

WO    WO 02/25723 A2    3/2002

OTHER PUBLICATIONS

"Phase-Sensitive Overlay Analysis Spectrometry," Mar. 1, 1990, IBM Technical Disclosure Bulletin, vol. 32, Issue No. 10A, pp. 170-174.*
W. Yang et al., "A Novel Diffraction Based Spectroscopic Method For Overlay Metrology," *SPIE's 28th Annual International Symposium and Education Program and Microlithography*, Feb. 2003, pp. 9.
T.A. Germer, "Measurement of lithographic overlay by light scattering ellipsometry," *Proceedings of SPIE*, Surface Scattering and Diffraction and Advanced Metrology II, vol. 4780, 2002, pp. 72-79.

(Continued)

*Primary Examiner*—Gregory J. Toatley, Jr.
*Assistant Examiner*—Gordon J. Stock, Jr.
(74) *Attorney, Agent, or Firm*—Stallman & Pollock LLP

(57) ABSTRACT

An overlay target includes two pairs of test patterns used to measure overlay in x and y directions, respectively. Each test pattern includes upper and lower grating layers. A single pitch (periodic spacing) is used for all gratings. Within each test pattern, the upper and lower grating layers are laterally offset from each other to define an offset bias. Each pair of test patterns has offset biases that differ by the grating pitch/4. This has the important result that the combined optical response of the test patterns is sensitive to overlay for all values of overlay. An algorithm obtains overlay and other physical properties of the two or more test patterns from their optical responses in one combined regression operation.

5 Claims, 7 Drawing Sheets

U.S. PATENT DOCUMENTS

| | | | |
|---|---|---|---|
| 2002/0158193 A1 | 10/2002 | Sezginer et al. | 250/237 |
| 2003/0042579 A1 | 3/2003 | Schulz | 257/629 |
| 2003/0043372 A1 | 3/2003 | Schulz | 356/327 |
| 2003/0044702 A1 | 3/2003 | Schulz | 430/30 |
| 2005/0018190 A1* | 1/2005 | Sezginer et al. | 356/401 |

OTHER PUBLICATIONS

H.T. Huang et al., "Scatterometry-Based Overlay Metrology," *SPIE (Microlithography 2003)*, vol. 5038, 2003. 12 pages in length.

M. Adel et al., "Characterization of Overlay Mark Fidelity," *SPIE Meeting on MicroLithography*, Feb. 2003, 8 pages in length.

\* cited by examiner pattern 702X  pattern 702XY  pattern 702Y

US 7,170,604 B2

OVERLAY METROLOGY METHOD AND APPARATUS USING MORE THAN ONE GRATING PER MEASUREMENT DIRECTION

PRIORITY CLAIM

This application claims priority from prior provisional application Ser. No. 60/394,191, filed Jul. 3, 2002, and Ser. No. 60/394,802, filed Jul. 10, 2002, both of which are incorporated herein by reference.

TECHNICAL FIELD

This invention relates to measuring the pattern overlay alignment accuracy of a pair of patterned layers on a semiconductor wafer, possibly separated by one or more layers, made by two or more lithography steps during the manufacture of semiconductor devices.

BACKGROUND OF THE INVENTION

Manufacturing semiconductor devices involves depositing and patterning several layers overlaying each other. For example, gate interconnects and gates of an integrated circuit are formed at different lithography steps in the manufacturing process. The tolerance of alignment of these patterned layers is less than the width of the gate.

Overlay is defined as the displacement of a patterned layer from its ideal position aligned to a layer patterned earlier on the same wafer. Overlay is a two dimensional vector ($\Delta x$, $\Delta y$) in the plane of the wafer. Overlay is a vector field, i.e., the value of the vector depends on the position on the wafer. Perfect overlay and zero overlay are used synonymously. Overlay and overlay error are used synonymously. Depending on the context, overlay may signify a vector or one of the components of the vector.

Overlay metrology provides the information that is necessary to correct the alignment of the stepper-scanner and thereby minimize overlay error on subsequent wafers. Overlay errors, detected on a wafer after exposing and developing the photoresist, can be corrected by removing the photoresist and repeating the lithography step on a corrected stepper-scanner. If the measured error is minor, parameters for subsequent steps of the lithography process could be adjusted based on the overlay metrology to avoid excursions.

Most prior overlay metrology methods use built-in test patterns etched or otherwise formed into or on the various layers during the same plurality of lithography steps that form the patterns for circuit elements on the wafer. One typical pattern, called "box-in-box" consists of two concentric squares, formed on a lower and an upper layer, respectively. "Bar-in-bar" is a similar pattern with just the edges of the "boxes" demarcated, and broken into disjoint line segments. The outer bars are associated with one layer and the inner bars with another. Typically one is the upper pattern and the other is the lower pattern, e.g., outer bars on a lower layer, and inner bars on the top. However, with advanced processes the topographies are complex and not truly planar so the designations "upper" and "lower" are ambiguous. Typically they correspond to earlier and later in the process. The squares or bars are formed by lithographic and other processes used to make planar structures, e.g., chemical-mechanical planarization (CMP). Currently, the patterns for the boxes or bars are stored on lithography masks and projected onto the wafer. Other methods for putting the patterns on the wafer are possible, e.g., direct electron beam writing from computer memory.

In one form of the prior art, a high performance microscope imaging system combined with image processing software estimates overlay error for the two layers. The image processing software uses the intensity of light at a multitude of pixels. Obtaining the overlay error accurately requires a high quality imaging system and means of focusing the system. One requirement for the optical system is very stable positioning of the optical system with respect to the sample. Relative vibration would blur the image and degrade the performance. This is a difficult requirement to meet for overlay metrology systems that are integrated into a process tool, like a lithography track. High-acceleration wafer handlers in the track cause vibration. The tight space requirements for integration preclude bulky isolation strategies.

As disclosed in U.S. Patent Application Serial No. 2002/0158193 (incorporated in this document by reference) one approach to overcoming these difficulties is to incorporate special diffraction gratings, known as targets, within semiconductor wafers. The targets are measured using scatterometry to perform overlay metrology. Several different grating configurations are described for the overlay targets. The simplest embodiment uses two grating stacks, one for x-alignment and one for y (each grating stack comprising two grating layers). An alternative embodiment uses two line grating stacks each for x and y (four grating stacks total). Still another embodiment uses three line grating stacks in combination to simultaneously measure both x and y alignment. (See also PCT publication WO 02/25723A2, incorporated herein by reference).

In FIG. 1A, one possible implementation for an overlay target is shown and generally designated 100. Target 100 includes two test patterns labeled 102X and 102Y. Test pattern 102X is used to measure displacement in the x-direction while test pattern 102Y is used to measure displacement in the y-direction. Target 100 is typically included in an unused wafer portion (such as within a scribe line). This prevents overlay target 100 from interfering with devices included on the semiconductor wafer.

FIG. 1B shows the structural details of test pattern 102X (and, by analogy test pattern 102Y). Each test pattern is a stack of gratings. As shown, test pattern 102X includes an upper grating 104U and a lower grating 104L. Gratings 104U and 104L have the same pitch 106 (in this document, period, spatial period, and pitch are used synonymously). Grating 104U is formed in an upper layer 108U and grating 104L is formed in a lower layer 108L. Upper and lower layers 108 may be separated by one or more intermediate layers 110.

To describe alignment between layers 108, FIG. 1B shows a symmetry plane 112U (for grating 104U and layer 108U) and symmetry plane 112L (for grating 104L and layer 108L). Symmetry plane 112U is offset from symmetry plane 112L by offset 114 (i.e., offset 114 is equal to x(112U)−x(112L)), the difference between the x-coordinates of the symmetry planes 112U and 112L. The value of offset 114 when the lithography is in perfect alignment is the offset bias of the grating stack 102X. An offset bias that is not zero or any other integer multiple of pitch/2 enables distinguishing the sign of the overlay. Symmetry planes 112 in FIG. 1B are not uniquely defined since there is one such symmetry plane for each line in grating 104U and 104L. The magnitude of the offset bias is understood to be the least distance between any choice of symmetry plane 112U in grating 104U and any choice of symmetry plane 112L in grating 104L. For a test pattern that consists of two stacked (overlaying) symmetric line gratings, the best value for offset bias is equal to pitch/4. The term symmetric line grating is defined by the following property: The unit cell of a symmetric line grating can be selected in a way that renders the unit cell substantially invariant under reflection with respect to a plane that is perpendicular to the direction of the pitch. Small geometric imperfections, such as line edge roughness, that do not significantly affect optical measurements are not construed to break the symmetry.

Overlay measurements are obtained by measuring the optical responses of test patterns 102X and 102Y, typically in sequence. The optical response can be measured by spectroscopic reflectometry, or spectroscopic ellipsometry, which do not spatially resolve the grating lines in test patterns 102X and 102Y. Overlay measurements are then calculated from the optical measurements by regression.

In FIG. 2A, another possible implementation for an overlay target is shown and generally designated 200. Overlay target 200 includes two test patterns for each direction in which overlay is to be measured. Test patterns 202X and 202X' are used for measurements in the x direction. Test patterns 202Y and 202Y' are used for measurements in the y direction. As will be shown, the use of two test patterns per direction offers significantly more robust measurement of overlay when compared to the implementations of FIGS. 1A and 1B.

FIG. 2B shows the structural details of test patterns 202X and 202X' (and, by analogy test patterns 202Y and 202Y'). As shown, test pattern 202X includes an upper grating 204U and a lower grating 204L. Test pattern 202X' includes an upper grating 204U' and a lower grating 204L'. Gratings 204U, 204L, 204U' and 204L' have the same pitch. Gratings 204U and 204U'are formed in an upper layer 208U and gratings 204L and 204L' are formed in a lower layer 208L. Upper and lower layers 208 may be separated by one or more intermediate layers 210. Patterned layers 208L and 208U may be formed on the same layer sequentially, in which case there are no intermediate layers 210. For example, both gratings may be etched at the zero-level on a silicon wafer to qualify a lithography projector. There may be zero or more layers between the substrate of the wafer and patterned layer 208L.

When layers 208U and 208L are in perfect alignment, test patterns 202X and 202X' are reflections of each other with respect to the x-axis. Test pattern 202X' can be obtained from test pattern 202X by the following transformation: (x',y')=(c1−x,c2+y) where c1 and c2 are constant distances. Similarly, under perfect alignment, test patterns 202Y and 202Y' are related by reflection with respect to the y-axis. Test pattern 202Y' can be obtained from test pattern 202Y by the following transformation: (x',y')=(c3+x,c4−y) where c3 and c4 are constant distances.

To describe alignment between layers 208, FIG. 2B shows two symmetry planes for test pattern 202X. These are labeled 212U (for upper grating 204U) and 212L (for lower grating 204L). FIG. 2B also shows two symmetry planes for test pattern 202X'. These are labeled 212U' (for upper grating 204U') and 212L' (for lower grating 204L'). Offset 214 is x(212U)−x(212L). Offset 214' is x(212U')−x(212L'). At perfect alignment, the value of offset 214 is pitch/4 and the value of offset 214' is −pitch/4. The value of offset 214 at perfect overlay is called the offset bias of grating stack (test pattern) 202X. Test pattern 202X and 202X' then have the same optical properties when they are viewed by a polarization insensitive reflectometer. When the upper layer is shifted in the x-direction by an overlay $\Delta x$ smaller than pitch/4 in magnitude, the magnitude of offset 214 becomes (pitch/4+$\Delta x$) and the magnitude of offset 214' becomes (pitch/4−$\Delta x$). This breaks the reflection symmetry of test patterns 202X and 202X' and their optical responses differ. The difference in the optical responses, such as difference of reflectance spectra, $R(\lambda, 202X)-R(\lambda, 202X')$, is proportional to $\Delta x$ for small offsets (where $\lambda$ denotes wavelength). Offset $\Delta x$ can be estimated from the difference spectra with a simple linear operator. Alternatively, the optical measurements from test patterns 202X and 202X' are fitted simultaneously with a model of the test patterns 202X and 202X' to regress the offset $\Delta x$:

$$\min_{\Delta x} \sum_{\lambda} \{[R(\lambda, \Delta x, \text{Meas.at}(202X)) - \qquad \text{Eq. 1}$$
$$R(\lambda, \Delta x, \text{Model}(202X))]^2 +$$
$$[R(\lambda, \Delta x, \text{Meas.at}(202X')) - R(\lambda, \Delta x, \text{Model}(202X'))]^2\}$$

In the model based regression, the offsets 214 and 214' depend solely on the unknown overlay $\Delta x$. All other parameters, such as thicknesses of deposited layers, line widths and heights are common to the models of test pattern 202X and 202X' since the two test patterns are next to each other and are subject to the same process conditions. The minimization above is with respect to $\Delta x$ and other parameters of the model, such as thicknesses of layers, which are not shown in the equation for brevity. The quantity that is minimized may be a weighted sum of squares or any other norm of the residual. Using two gratings with different offset biases doubles the number of measurements without adding any unknown parameters over what is used in the basic approach described in FIGS. 1A and 1B. Therefore, regression applied to measurements at two grating stacks with different offset biases yields a more robust estimate of the overlay. The offset in the y-direction, $\Delta y$, is found by a similar but separate regression applied to the measurements at test patterns 202Y and 202Y'.

Simultaneously regressing measurements at two grating stacks, where the offset biases of the gratings stacks differ by pitch/2, shares two limitations of the basic approach described in FIGS. 1A and 1B. The first limitation is the range of unambiguous offset measurements. Both approaches give ambiguous results when overlay exceeds ±pitch/4 for symmetric line gratings. FIG. 3a shows the test pattern 202X and 202X' when overlay is $\Delta x=-\text{pitch}/4$. In this case offset 214 is zero and offset 214' is −pitch/2. FIG. 3b shows the test pattern 202X and 202X' when overlay is $\Delta x=+\text{pitch}/4$ and the offset 214 is pitch/2 and offset 214' is zero. Let $R(\lambda, \Delta x)$ denote the optical response of test pattern 202X when the upper test pattern layer is displaced from perfect alignment by $\Delta x$ in the x-direction. By symmetry:

$$R(\lambda,[\text{pitch}/4]+\Delta x)=R(\lambda,[\text{pitch}/4]-\Delta x)\ R(\Delta,-[\text{pitch}/4]+ \\ \Delta x)=R(\lambda,-[\text{pitch}/4]-\Delta x) \qquad \text{Eq. 2}$$

This limits the measurement range to half a period of the grating stack. The second limitation of the prior art follows from the two equations above: The sensitivity of the optical properties to overlay is zero when $\Delta x=\pm\text{pitch}/4$:

$$\frac{\partial R}{\partial(\Delta x)}(\lambda, \pm\text{pitch}/4) = 0 \qquad \text{Eq. 3}$$

FIG. 4 shows the computed reflectance spectra for a particular test pattern 202X as a function of overlay (Δx) for four different wavelengths. At each wavelength, the partial derivative of reflectance with respect to overlay is zero when the overlay is ±pitch/4, as indicated by vertical dashed lines in FIG. 4. Test pattern 202X and 202X' and their combination have dead-zones in the vicinity of overlay=±pitch/4.

FIG. 5 shows the results of the regression applied to an actual measurement. The horizontal axis is the known overlay and the vertical axis is the overlay estimated by scatterometry using a pair of test pattern stacks for each direction. The measurement breaks down in a neighborhood of the dead zones Δx=±pitch/4. When the actual overlay is between pitch/4 and pitch/2, the estimated offset becomes (pitch/2)−(actual overlay).

Prior art teaches that this limitation can be avoided by making the grating layers asymmetric, for example by having two lines of distinct widths and two spaces of distinct widths in the unit cell (one period) of the grating layer. Using asymmetric lines increases the number of unknown parameters of the model since the widths of the two lines can change independently according to process variations. This increases the computational burden and makes the measurement less robust.

SUMMARY

An embodiment of the present invention provides an overlay target for measuring the alignment between two layers on a semiconductor wafer. For a typical implementation, the overlay target includes four test patterns. Each test pattern includes an upper grating layer and a lower grating layer. The lines in one pair of the test patterns (i.e., in their grating layers) are aligned with the y-axis and are used to measure overlay in the x-direction. The lines in the remaining pair of test patterns are aligned with the x-axis and are used to measure overlay in the y-direction. A single pitch (periodic spacing) is used for all of the gratings in all of the test patterns.

Within each test pattern, the upper and lower grating layers are laterally offset from each other. This means that the lines in the upper grating layer are not directly above the lines in the lower grating layers. The distance by which the upper and lower layers are offset is known as the offset bias. Each of the four test patterns has its associated offset bias.

The pair of test patterns that measure in the x direction have offset biases that differ by pitch/4. Similarly, the pair of test patterns that measure in the y direction have offset biases that differ by pitch/4.

A consequence of the pitch/4 difference between the offset biases of the two test patterns is that there is no overlay value at which the sensitivity to overlay vanishes (there are no measurement "dead-zones").

In some cases, it is possible to reduce the number of test patterns in the overlay target. For this type of implementation three test patterns are used. Typically, one test pattern is aligned with the x-axis and is used to measure overlay in the y-direction. A second test pattern is aligned with the y-axis and is used to measure overlay in the x-direction. The third test pattern is oriented at an angle that is intermediate to the first two test patterns (often at forty-five degrees). Once again, the result is an overlay target that operates without measurement dead zones.

The present invention also provides a method for analyzing overlay using the overlay targets described above. For this method, a scatterometer (reflectometer or ellipsometer) is used is measure the optical responses of the multiple test patterns in an overlay target, typically sequentially. The optical responses of multiple targets are analyzed together in one regression operation.

There is a theoretical model for each test pattern. The theoretical model predicts the optical response of the test pattern (the electromagnetic field that is reflected and diffracted when an incident field is applied to the test pattern). The theoretical model has adjustable and unknown parameters. Each physical characteristic of the test patterns, such as overlay, line width, line profile, and layer thickness, that are to be determined from the measurements, are represented by the unknown parameters. For example, a line width is either one of the unknown parameters or it is a simple function of one or more parameters. Most importantly, some of the parameters are common to more than one test pattern. For example, the thickness of a deposited, un-patterned film 210 is the same at all test patterns within an overlay target. A regression is performed in which the computational model is repeatedly evaluated and the parameters are updated to minimize the differences between the calculated and measured optical responses of multiple test patterns. The quantity that is minimized is a norm of the vector obtained by concatenating the vectors of fit errors that belong to multiple test patterns. Fit error is the difference between the calculated and measured optical responses. The fit error at each test pattern is a vector (or equivalently, an array) because the optical response is measured for multiple values of independent variables such as wavelength, or angle of incidence. When the norm of the concatenated residuals has been minimized within a desired goodness of fit, it is assumed that the model and its associated parameters accurately reflect the test patterns.

In the case where the physical reality is such that a certain characteristic, such as a film thickness, is the same for multiple test patterns and that characteristic is represented by one adjustable parameter, the regression (inverse) problem becomes more over-determined and better conditioned since multiple measurements have been taken for a reduced set of unknown parameters. This technique is specifically applicable to overlay analysis, but can also be used for other cases that require analysis of multiple independent measurements.

DETAILED DESCRIPTION OF THE PREFERRED EMBODIMENTS

Figure 1A:
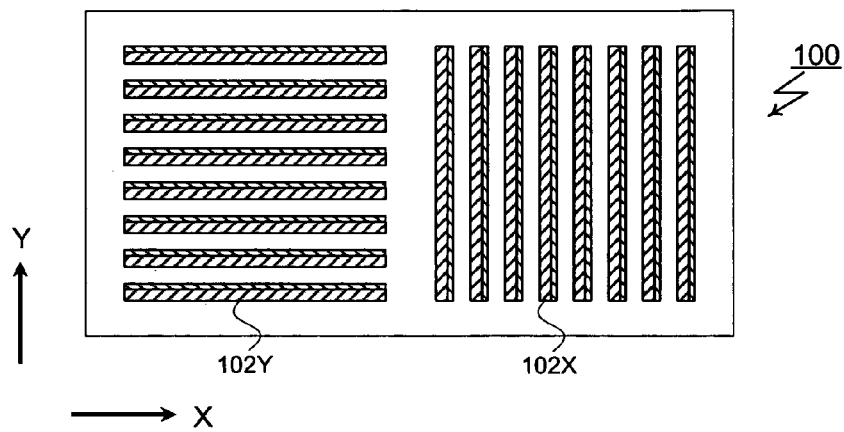
FIG. 1A is a top view of a prior art overlay target.
Figure 1B:
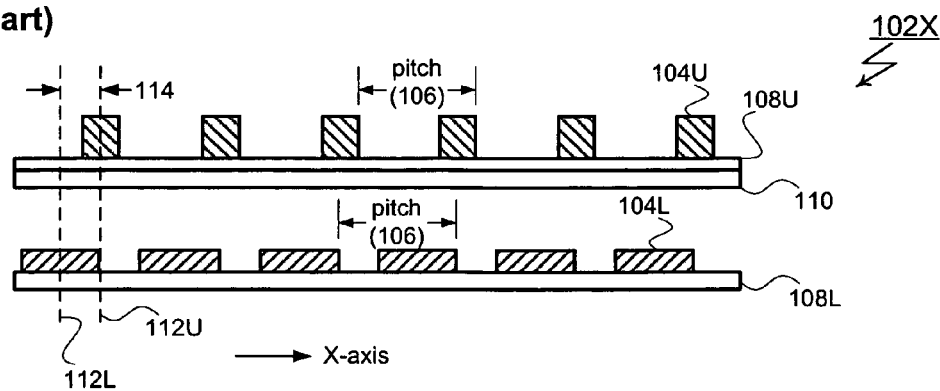
FIG. 1B is cross sectional view of the prior art overlay target of FIG. 1A.
Figure 2A:
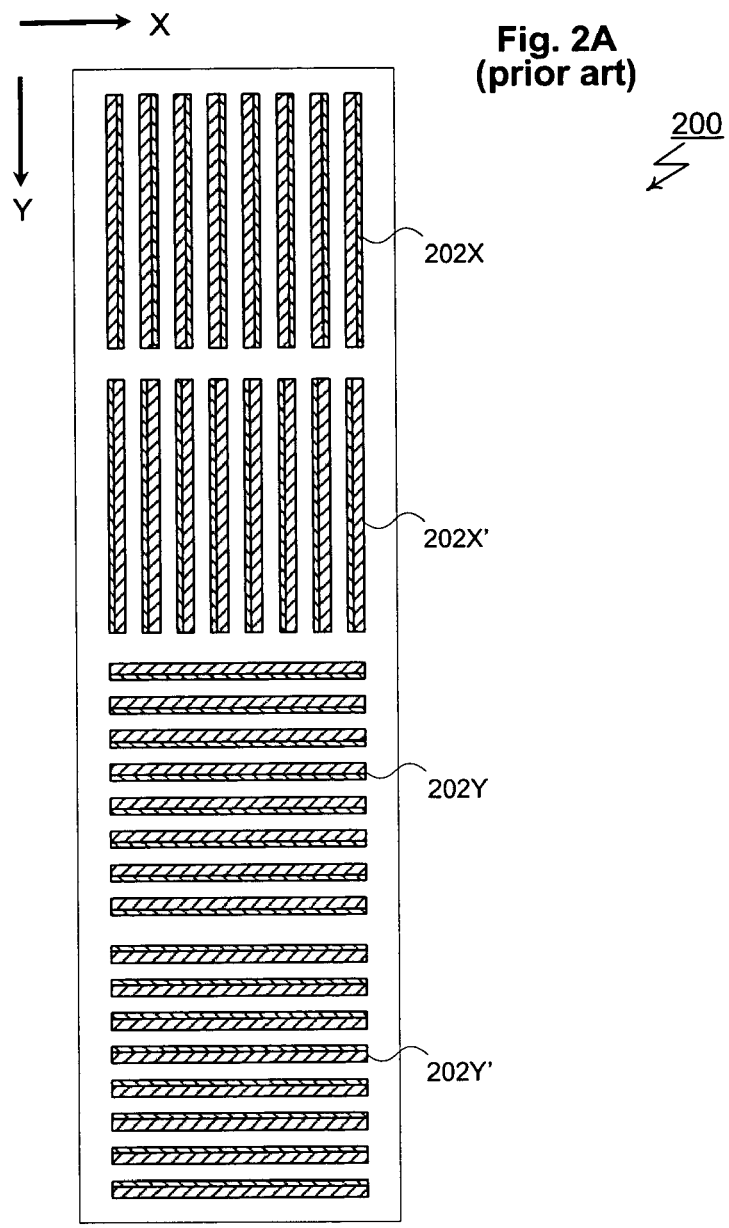
FIG. 2A is a top view of a prior art overlay target.
Figure 2B:
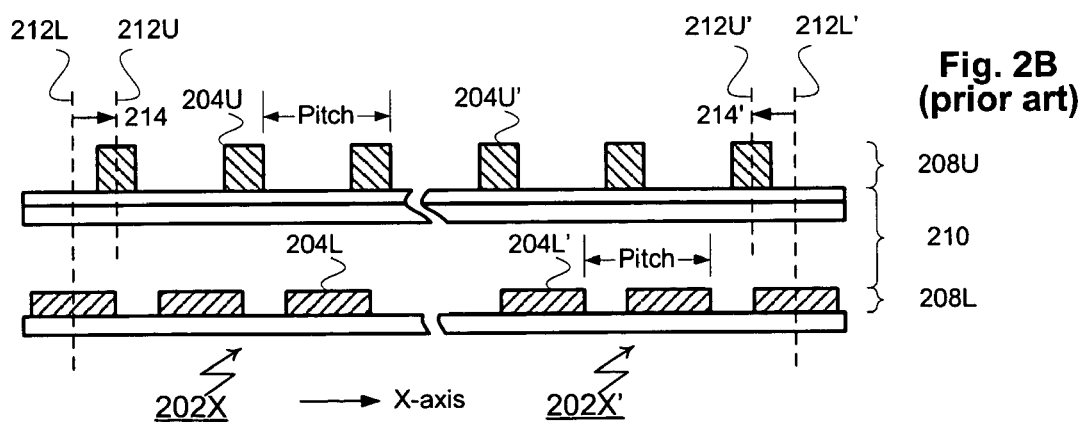
FIG. 2B is cross sectional view of the prior art overlay target of FIG. 2A.
Figure 3A:
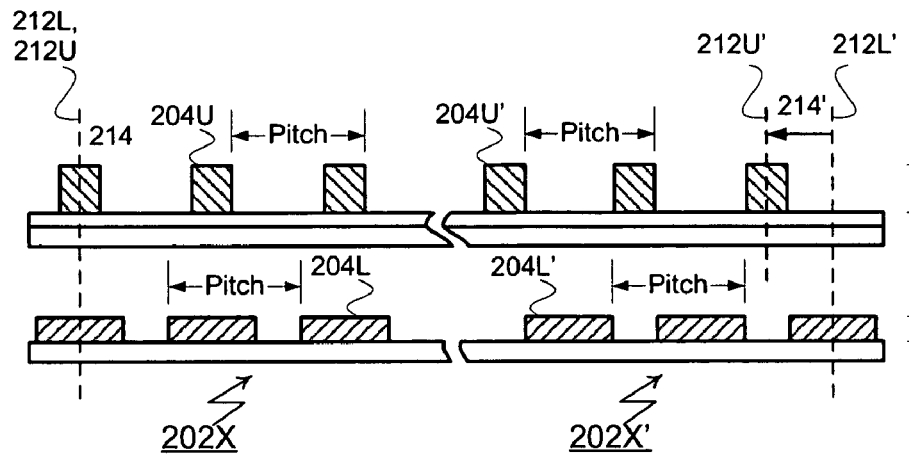
FIG. 3A repeats the cross sectional view of FIG. 2B with an alignment shift to illustrate a limitation of prior art overlay targets.
Figure 3B:
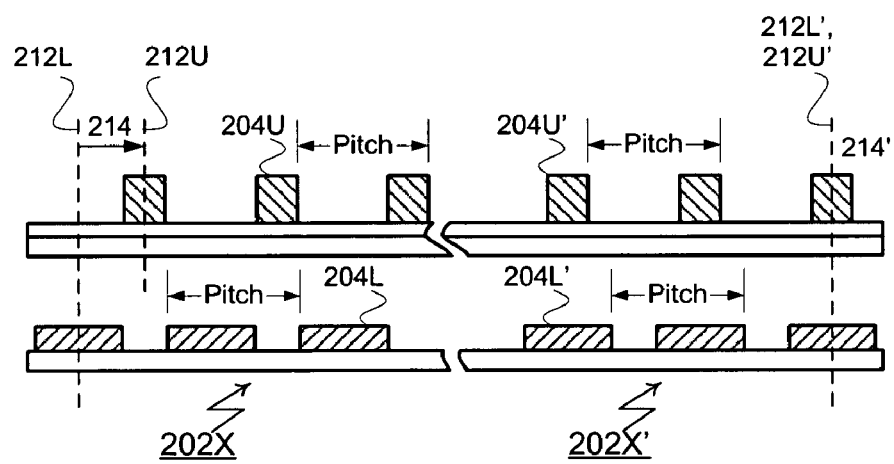
FIG. 3B repeats the cross sectional view of FIG. 2B with an alignment shift to illustrate a limitation of prior art overlay targets.
Figure 4:
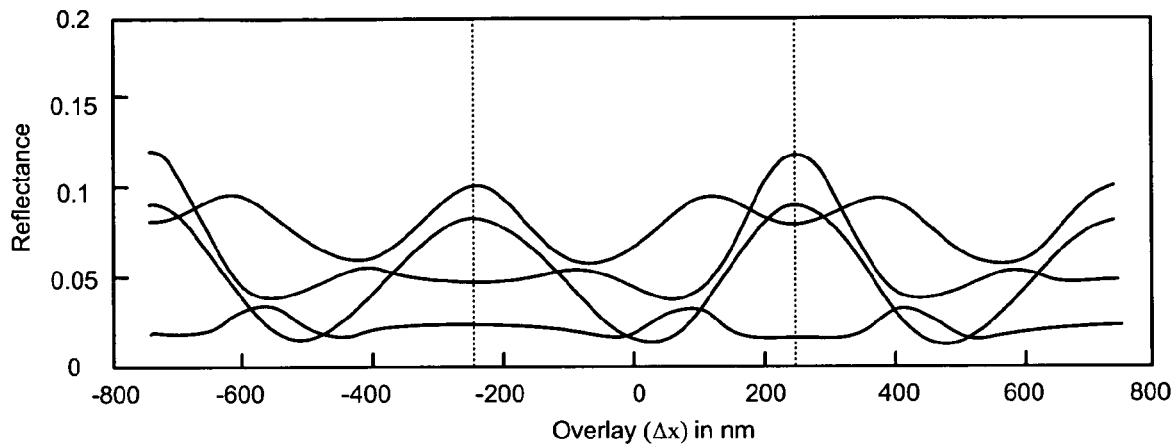
FIG. 4 shows the computed reflectance spectra for a particular test pattern within the overlay target of FIG. 2A as a function of offset for four different wavelengths.
Figure 5:
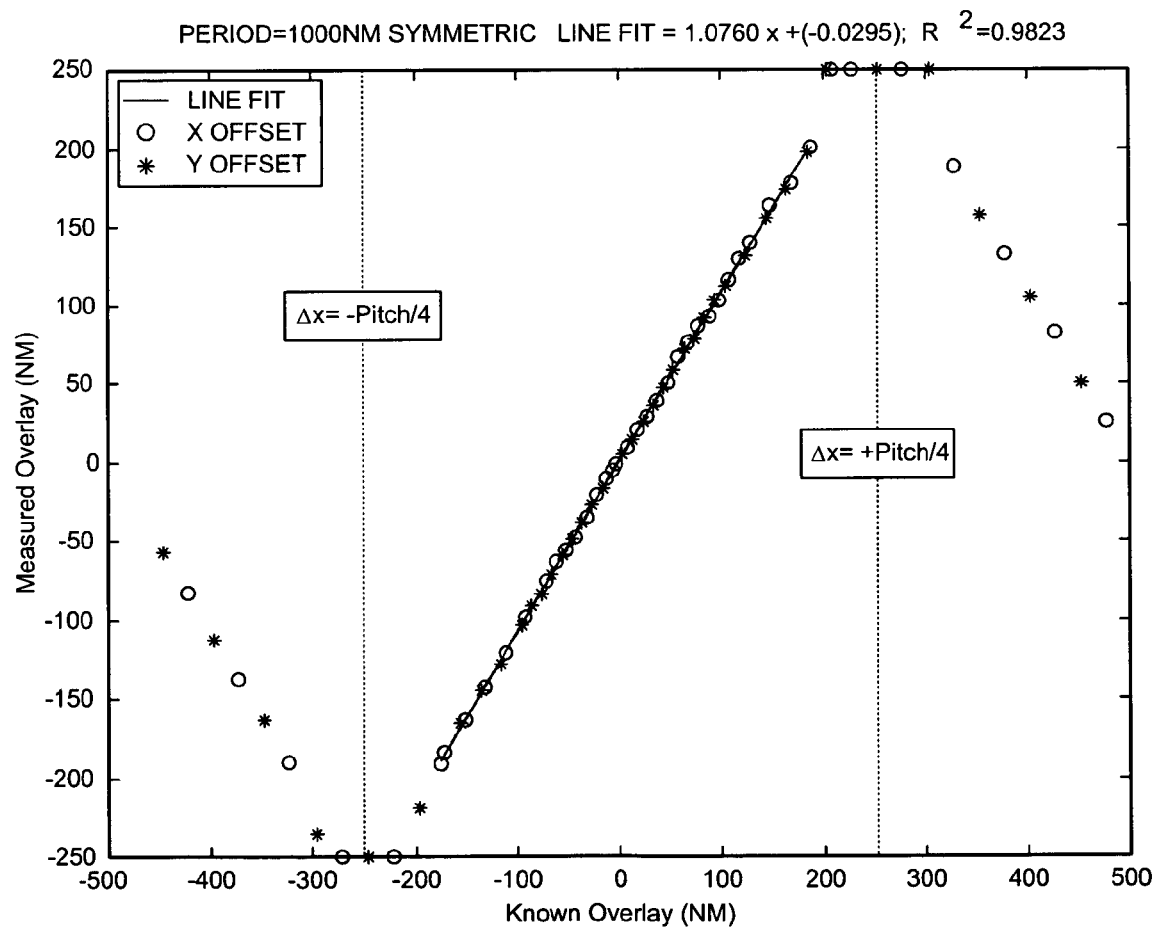
FIG. 5 shows overlay obtained by the method of Equation 1, as a function of the known value of the overlay, on an actual implementation of the overlay target of FIG. 2.

An embodiment of the present invention uses an overlay target as shown in FIG. 2A. As described previously, test patterns 202X and 202X' are used for measurements in the x direction. Test patterns 202Y and 202Y' are used for measurements in the y direction.

Figure 6A:
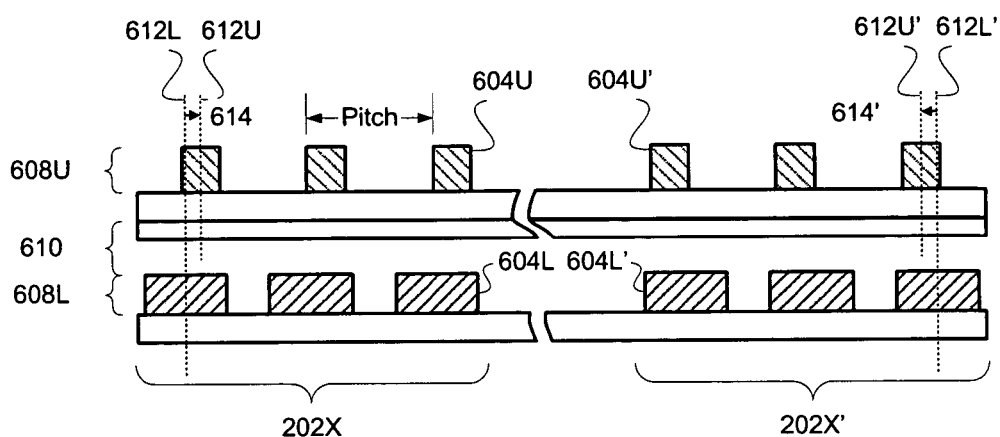
FIG. 6A is cross sectional view of the overlay target of FIG. 2A implemented using a layer structure of the present invention.
Figure 6B:
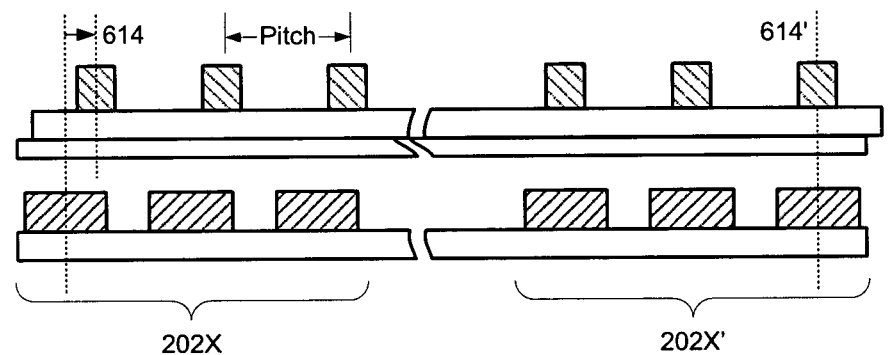
FIG. 6B repeats the cross sectional view of FIG. 6A with an alignment shift to illustrate absence of offset induced measurement "dead zones".

FIG. 6A shows an implementation of test patterns 202X and 202X' that uses the grating layer structure of the present invention. For this implementation, test pattern 202X (and, by analogy, test pattern 202X') includes an upper grating 604U and a lower grating 604L. Upper grating 604U is formed in an upper layer 608U and lower grating 604L is formed in a lower layer 608L. Upper and lower layers 608U and 608L, respectively, may be separated by zero or more intermediate layers 610. Upper grating 604U and lower grating 604L have the same pitch. As evident in this particular example, different line profiles (i.e., shape, height and width) may be used for upper grating 604U and lower grating 604L. The grating lines in FIGS. 6A and 6B are shown to have rectangular cross sections for simplicity. In reality, the cross sections of all grating lines are different than rectangles.

To describe the offset between upper grating 604U and lower grating 604L, FIG. 6A shows two symmetry planes for test pattern 202X. These are labeled 612U (for upper grating 604U) and 612L (for lower grating 604L). FIG. 6A also shows two symmetry planes for test pattern 202X'. These are labeled 612U' (for upper grating 604U') and 612L' (for lower grating 604L'). Offset bias of grating stack 202X is defined as the value of the offset 614 (i.e., x(612U)−x(612L)) the difference in the x-coordinates of the symmetry planes 612U and 612L, when the lithography process is in perfect alignment. Similarly, offset bias of grating stack 202X' is defined as the value of offset 614'(x(612U')−x(612L')) when the lithography process is in perfect alignment. Upper grating 604U and lower grating 604L are offset so that the difference between offset biases of 202X and 202X' is equal to pitch/4, i.e.:

$$[x(612U)-x(612L)]-[x(612U')-x(612L')]=\text{pitch}/4 \qquad \text{Eq. 4}$$

This can be seen for example, in FIG. 6A where lithography alignment is perfect and offset bias of grating stack 202X is equal to offset 614, which is equal to pitch/8. Offset bias of grating stack 202X' is equal to offset 614', which is equal to −pitch/8. The difference between offset 614 and offset 614' is constant and is not affected by changes in the alignment between upper layer 608U and lower layer 608L. Alignment changes do, however change the values of offset 614, and offset 614'. This is evident in FIG. 6B where upper layer 608U has been shifted to the left with the result that offset 614 is now pitch/4 and offset 614' is now zero.

In general, small changes in alignment between upper layer 608U and lower layer 608L cause offset 614 to either increase or decrease in magnitude. At the same time, offset 614' is affected in the opposite manner. An important result of the pitch/4 difference between the offset biases is that grating stacks 202X and 202X' are never in their dead-zones simultaneously. This follows because the dead zone of test pattern 202X occurs at the point of maximum sensitivity for test pattern 202X'. As shown in FIG. 6B, the converse is also true, meaning that the dead zone of test pattern 202X' occurs at the point of maximum sensitivity for test pattern 202X.

For typical implementations, test pattern 202X and test pattern 202X' have the configuration shown in FIG. 6A (i.e., where offset bias 614 is equal to pitch/8 and offset bias 614' is equal to −pitch/8) when upper layer 608U and lower layer 608L are perfectly aligned. Other configurations could be used for the perfect alignment case. Thus, it is entirely possible to use the configuration of FIG. 6B to signify perfect alignment. Use of the configuration of FIG. 6A to signify perfect alignment is preferred because it means that offset bias 614 and offset bias 614' have the same magnitude (i.e., pitch/8) when alignment is perfect. This means that test patterns 202X and 202X' have the same optical properties as seen by a polarization insensitive reflectometer at the point of perfect alignment between layers 608U and 608L. The differences of the reflectances, R(λ, 202X)−R(λ, 202X') is zero at perfect overlay and linearly related to small overlay Δx. This property provides a linear method of estimating overlay.

Another benefit of having a difference of Pitch/4 between the offset biases of test patterns 202X and 202X' is the extended range of overlay measurement. The measurement range is limited by ±pitch/2 when the difference between the two offset biases is pitch/4, whereas the measurement range is limited by ±pitch/4 when the difference between the offset biases is pitch/2 as described in prior art.

Figure 7A:
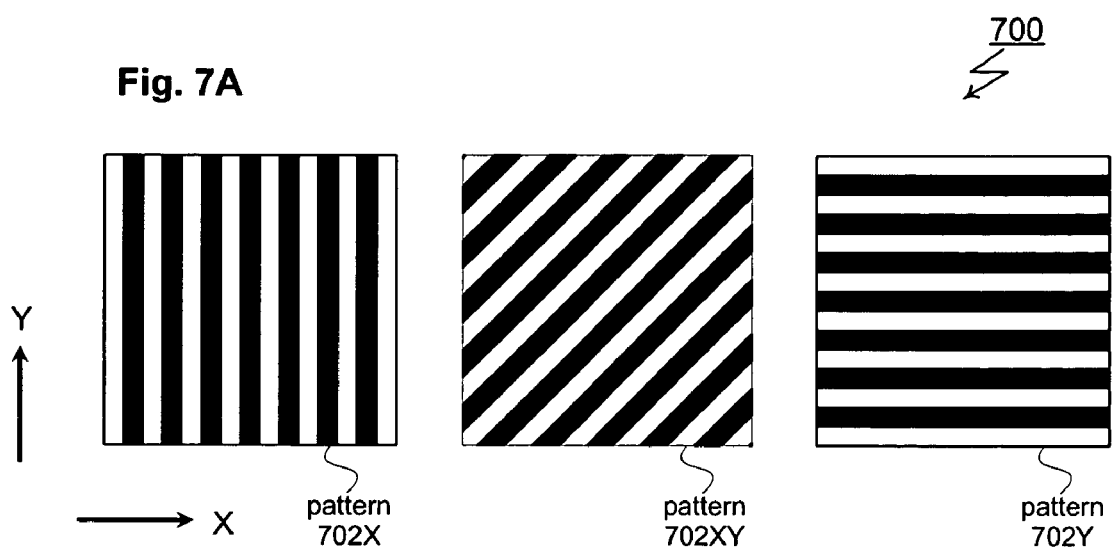
FIG. 7A is a top view of an overlay target using three test patterns as provided by the present invention.

The grating layer structure just described overcomes the dead-zone ambiguity of prior art overlay targets. In some cases, however, the use of four test patterns may be undesirable in terms of area required or computational effort. To reduce the number of test patterns, it is possible to use the grating layer structure within an overlay target that includes three test patterns. As shown in FIG. 7A, an implementation of this type of overlay target 700 includes test patterns 702X, 702Y and 702XY. Each test pattern is a grating formed as a series of lines. Each test pattern has a different orientation—test patterns 702X and 702Y are oriented so that their lines are perpendicular to each other. Test pattern 702XY is oriented so that its lines are oriented at a forty-five degree angle with respect to both test pattern 702X and test pattern 702Y.

Figure 7B:
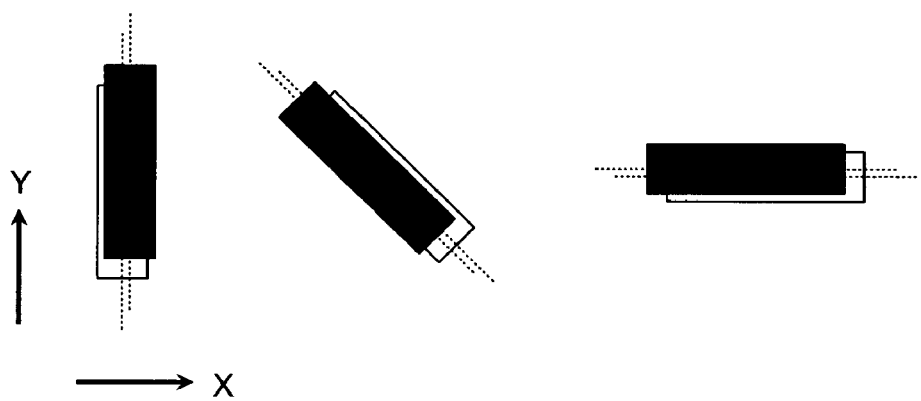
FIG. 7B shows the overlay target of FIG. 7A implemented using the layer structure of FIG. 6A.

In the implementation of FIG. 7A, test patterns 602X' and 602Y' are combined to form test pattern 702XY. The offset bias of grating 702XY is set to be pitch/4 different from both gratings 702X and 702Y. The optical properties of test patterns 702X, 702Y and 702XY are fitted simultaneously by a model of the three grating stacks to obtain the two components of overlay, Δx and Δy. This difference of pitch/4 can be accomplished by setting the offset bias of test patterns 702X and 702Y to be +pitch/8 while the offset bias of grating 702XY is set to −pitch/8. This is illustrated by FIG. 7B which shows one set lines of the lower and upper grating layers of test patterns 702X, 702XY and 702Y. In this configuration, if the x-offset is near (−pitch/8) or (3 pitch/8), grating 702X is in its dead zone but 702XY is not. Similarly, if the y-offset is near (−pitch/8) or (3 pitch/8), test pattern 702X is in its dead zone but 702XY is not.

Vertical and horizontal lines can have different widths and profiles due to astigmatism in lithography projection and scan rate errors in stepper scanners. The three-test pattern implementations can only be used where lithography asymmetries between vertical and horizontal lines can be minimized.

Figure 7C:
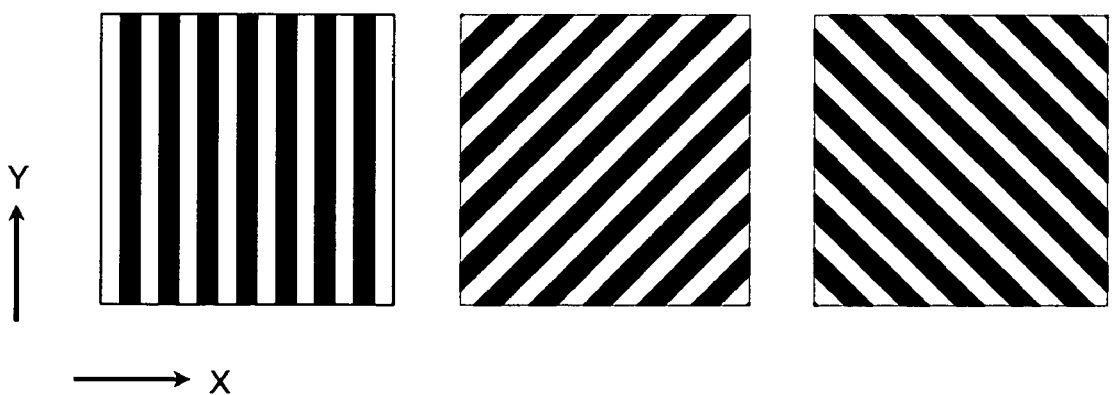
FIG. 7C is a top view of another implementation of the overlay target using three test patterns as provided by the present invention.

Permutations of the basic three test pattern combination are possible. As an example, FIG. 7C shows an implementation of the overlay target that includes one test pattern oriented at 90 degrees, a second oriented at forty-five degrees and a third oriented at negative forty-five degrees with respect to the x-axis. This particular implementation is particularly desirable because a step-and-scan printer may introduce similar geometry errors in the two diagonal test patterns. This allows the two diagonal test patterns to be assumed to be identical except for the overlay displacement. This differs from the implementation of FIG. 7A where each of the three test patterns can have different line width profiles.

Using three test patterns 702 has several advantages. First, some of the parameters, such as thicknesses of deposited films, are common to all three test patterns 702. This information makes the regression problem more over-specified and robust. The extreme of this approach assumes that all parameters other than offsets are common to the three test patterns 702. When this assumption is valid, the test patterns 702 can be configured so that their reflectance spectra are identical when the overlay is zero. A second application of the three-grating configuration is to extend the overlay measurement range. With only two gratings (one for x and one for y) the overlay measurement can be ambiguous due to the gratings' periodic symmetry, making it impossible to measure overlay that exceed one quarter of a period in magnitude. This can be overcome using two gratings of different periods per direction, a total of four gratings, to resolve the ambiguity. For example, if one grating has a period of 1000 nm in the x direction, and another grating has a period of 1200 nm in the x direction, the two gratings in combination have a measurement range limited by ±1500 nm (the least common multiple of 1000/4 nm and 1200/4 nm). The three-grating configuration provides the same extension of range for the x and y measurements using one less grating. The three-grating configuration achieves the range extension using three gratings of the same period. For example, when a grating with period 1000 nm is oriented forty-five degrees from the x-axis, its x-period and y-period are both 1414 nm. Using gratings of the same period saves time and storage for calculating a database of spectra. A pre-computed database of spectra can be used to increase the robustness and decrease the time of regression during the measurement.

Although FIGS. 6 and 7 show solid grating lines, in practice, each line can be made up of a grating at a finer pitch. A line can be segmented into smaller lines that are perpendicular or parallel to the original line. Alternatively, a line can be made up of a finer array of holes, posts or other three dimensional structures. Making the finer scale structures at the pitch of the devices on the wafer offers two advantages. The overlay marks and devices can be optimized simultaneously for chemical mechanical planarization (CMP) and they suffer similar CMP effects. Secondly, the overlay marks and devices use similar parts of the aperture (wavenumber space) of the lithography projector. Therefore, they are subject to similar optical aberrations. Both effects make the overlay marks more representative of the devices.

The present invention also provides a method for analyzing overlay using the overlay targets of FIGS. 6 through 7. For this analysis method, optical response of each test pattern in an overlay target is measured. In most cases, this is accomplished by performing reflectometry or ellipsometry measurements for each test pattern as a function of one or more independent variables (wavelength $\lambda$, incidence or collection angle $\theta$, incidence or collection azimuth $\phi$, polarization states of illumination and detection). This process is typically performed sequentially with each test pattern being measured in turn. A model-based regression (inversion) is then performed to jointly determine the physical properties of the test patterns.

There is a theoretical model for each test pattern. The theoretical model predicts the optical response of the test pattern (the electromagnetic field that is reflected and diffracted when an incident field is applied to the test pattern). The theoretical model is typically evaluated using rigorous coupled wave analysis, similar to the models employed in U.S. Pat. Nos. 5,963,329 and 5,867,276. Alternative models for electromagnetic scattering can also be used, such as the finite difference method, finite-difference time-domain approach, the boundary integral method, volume integral equation formulations, or the Born approximation.

The theoretical model has adjustable and unknown parameters. Each physical characteristic of the test patterns, such as overlay, line width, line profile, and layer thickness, that are to be determined from the measurements, are represented by the unknown parameters. For example, a line width is either one of the unknown parameters or it is a simple function of one or more parameters. Most importantly, some of the parameters are common to more than one test pattern. For example, the thickness of a deposited, un-patterned film 610 is the same at all test patterns within an overlay target. Another example: overlay $\Delta x$ determines the position of the upper grating with respect to the lower grating in test patterns 202X and 202X'.

A regression is performed in which the computational model is repeatedly evaluated and the parameters are updated to minimize the differences between the calculated and measured optical responses of multiple test patterns. The quantity that is minimized, $\chi$, is a norm of the fit errors of multiple test patterns. One example of such a norm is:

$$\chi^n(\xi) = \sum_v \sum_P w(v, P) \left| \frac{\text{Measured optical response}(v, P) -}{\text{Calculated optical response}(v, P, \xi)} \right|^n \quad \text{Eq. 5}$$

where n is a positive and fixed exponent. The symbol $\xi$ is an array of all unknown and adjustable parameters. The index P labels the multiple test patterns. The summation runs over all test patterns included in the regression. The optical responses of test patterns are measured as a function of independent variables denoted by $v$. The summation runs over all values of independent variables at which measurements are taken. The independent variables can be any combination of wavelength, polar and azimuthal angles of incidence and polarization states of illumination and detection. If there is more than one independent variable, $v$ is array-valued. The weighting $w(v,P) > 0$ is a positive valued function of the independent variables of measurement. It serves to emphasize or de-emphasize some measurements depending on their reliability. If the variance of measurement error is independent of ν and P, then the weighting function w(ν,P) is replaced by unity. When w(ν,P)=1 and n=2, $\chi''(\xi)$ is the Euclidian length of the vector formed by concatenating the fit errors, or residuals, of the test patterns. The fit error of a test pattern is the difference between its measured and calculated optical responses. The optical response, hence the fit error of a test pattern is array-valued.

There is no limit on the number of norms that can be constructed that are distinct from the one in Eq. 5. For example, setting n=1 in Eq. 5 and replacing the summations by maximum over ν and P yields a valid norm. In the preferred norm, n=2 and 1/w(ν,P) is proportional to the variance of the measurement error at (ν,P).

The function $\chi(\xi)$ is minimized using standard techniques of minimization such as Levenberg-Marquardt, Gauss-Newton, steepest descent, simulated annealing, or genetic algorithms.

Figure 8:
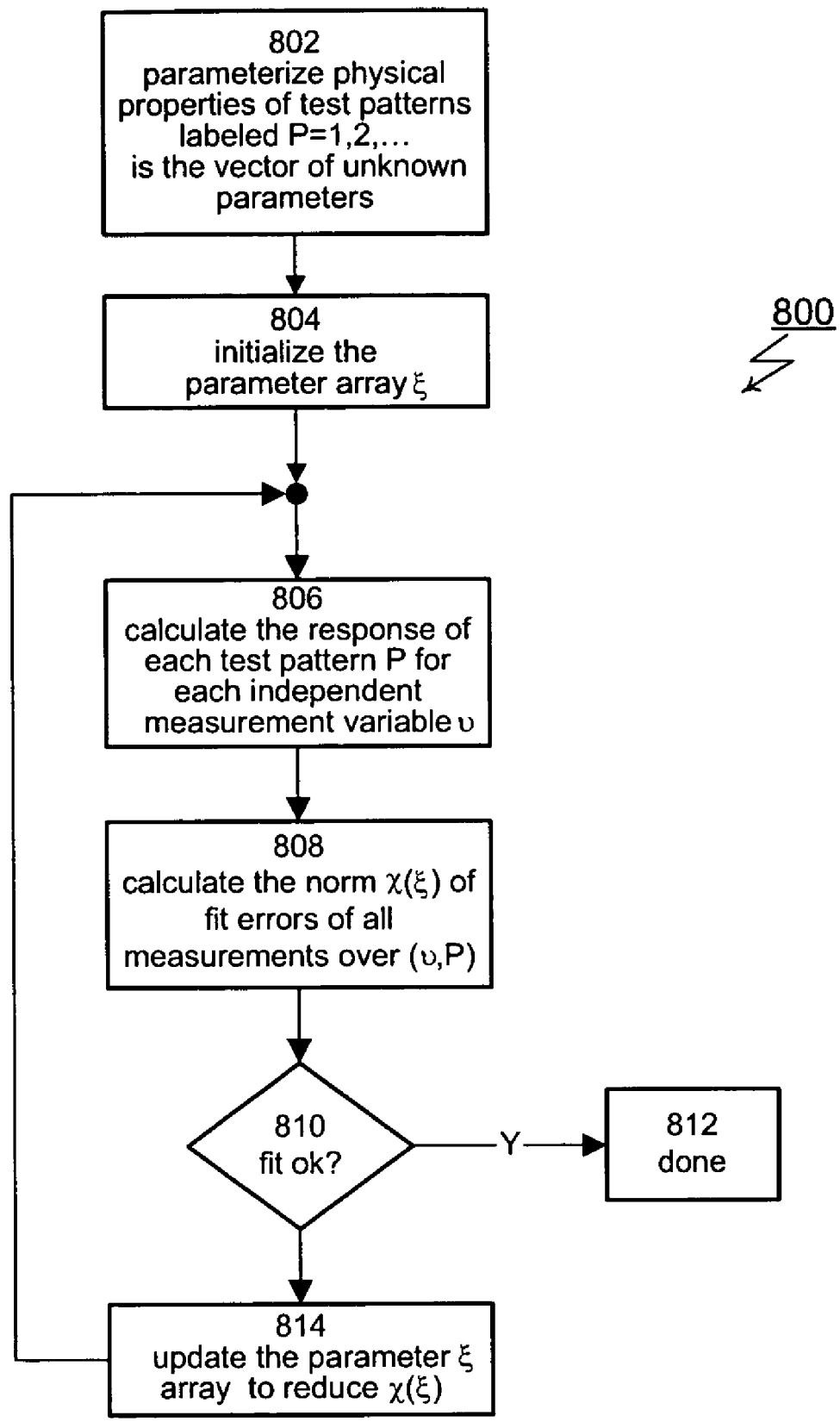
FIG. 8 is a flowchart showing the steps associated with a method for concurrently analyzing measurements taken from multiple test sites.

FIG. 8 shows a flow chart 800 for the algorithm. At 802, physical properties of test patterns are expressed in terms as a few as possible unknown and adjustable parameters. At 804, an initial estimate is provided for the vector of unknown parameters, $\xi$. When similar measurements are performed repeatedly, the results of the previous measurement can be used as the initial guess for the current measurement. At 806, the theoretical optical response of each test pattern is calculated for each value of the independent measurement variable(s) ν (such as wavelength). Step 806 is suitable for parallel computation. At 808, the norm $\chi(\xi)$ of the fit error is calculated according to Eq. 5. At 810, the magnitude of $\chi(\xi)$ or possibly its rate of decrease are compared to previously set thresholds. If $\chi(\xi)$ is sufficiently low (goodness of fit sufficiently high) or if $\chi(\xi)$ has not decreased in the past several steps, or if a previously set upper bound for number of iterations or computation time is reached, the iteration is terminated at 812. If $\chi(\xi)$ is sufficiently small, $\xi$ is the vector of measured parameters (output). Otherwise, the parameter vector $\xi$ is updated to minimize $\chi(\xi)$ according to one of the following algorithms for nonlinear minimization: Levenberg-Marquardt, Gauss-Newton, steepest-descent, simulated annealing, or genetic algorithms (see step 814).

The subject invention is applicable to targets used for overlay metrology whether they are gratings of the type described herein or prior art gratings or isolated targets. The subject invention can also be used to improve the measurement and analysis of CD parameters themselves, such as spacing, height and side-wall angle.

What is claimed is:

1. An overlay target for optically measuring the overlay alignment of layers formed on a semiconductor wafer comprising:

first and second test patterns, each including an upper grating layer and a lower grating layer, each grating layer including a series of substantially parallel lines, the upper grating lines of each test pattern aligned to be substantially parallel to the lower grating lines of the same test pattern, each test pattern having an associated offset bias defined by a lateral offset of the upper and lower grating layers of the test pattern, where a single line pitch is used for all gratings in all test patterns and where the difference between the offset bias of the first test pattern and the offset bias of the second test pattern is substantially equal to the line pitch divided by four whereby the combined optical response to the measurement of the first and second test patterns is sensitive to all values of overlay alignment.

2. An overlay target as recited in claim 1, wherein the magnitude of the offset bias of the first test pattern is equal to the line pitch divided by eight.

3. An overlay target as recited in claim 1, wherein the upper and lower grating lines of the first test pattern are substantially parallel to the upper and lower grating lines of the second test pattern.

4. An overlay target as recited in claim 1, that further comprises:

a third test pattern, including an upper grating layer and a lower grating layer, each grating layer including a series of substantially parallel lines, the lines of the upper and lower gratings of the third test pattern aligned to be substantially parallel to each other, where the lines in the third test pattern are spaced at the same line pitch used for the first and second test patterns.

5. An overlay target as recited in claim 4, where the grating lines of the first, second and third test patterns have three different angular orientations in plane of the wafer.

* * * * *